US012800638B2

United States Patent

(12) United States Patent
Tsubata et al.

(10) Patent No.: US 12,800,638 B2
(45) Date of Patent: Nov. 17, 2026

(54) ANALYSIS METHOD

(71) Applicants: SUBARU CORPORATION, Tokyo (JP); JAPAN AEROSPACE EXPLORATION AGENCY, Tokyo (JP)

(72) Inventors: Hiroyuki Tsubata, Tokyo (JP); Hiromitsu Miyaki, Tokyo (JP); Takao Okada, Tokyo (JP)

(73) Assignees: SUBARU CORPORATION, Tokyo (JP); JAPAN AEROSPACE EXPLORATION AGENCY, Tokyo (JP)

(*) Notice: Subject to any disclaimer, the term of this patent is extended or adjusted under 35 U.S.C. 154(b) by 163 days.

(21) Appl. No.: 19/014,849

(22) Filed: Jan. 9, 2025

(65) Prior Publication Data

US 2025/0237687 A1 Jul. 24, 2025

(30) Foreign Application Priority Data

Jan. 19, 2024 (JP) ................................ 2024-007040

(51) Int. Cl.
*G01R 29/12* (2006.01)

(52) U.S. Cl.
CPC ................................... *G01R 29/12* (2013.01)

(58) Field of Classification Search
None
See application file for complete search history.

(56) References Cited

U.S. PATENT DOCUMENTS

2020/0117767 A1* 4/2020 Colleran ................ G06Q 50/20

FOREIGN PATENT DOCUMENTS

| | | | |
|---|---|---|---|
| CN | 115828679 | A | 3/2023 |
| CN | 116757046 | A | 9/2023 |
| JP | 2021-133860 | A | 9/2021 |

OTHER PUBLICATIONS

Extended European Search Reported dated Jun. 5, 2025, issued in corresponding EP Application No. 25151388.3, 7 pages.

(Continued)

*Primary Examiner* — Jas A Sanghera
(74) *Attorney, Agent, or Firm* — Rimon P.C.

(57) ABSTRACT

The analysis method includes: executing an electrostatic field analysis process of deriving an electric field strength in an analysis space; executing an increasing process of increasing a negative-charged particle density and a positive-charged particle density of a cell by a predetermined first coefficient; executing a reduction process of reducing the negative-charged particle density and the positive-charged particle density of each of the cells in the analysis space by each predetermined second coefficient; executing a negative-charged particle emission process of increasing the negative-charged particle density of a cell around a surface in the analysis space by a predetermined third coefficient; executing an advection process of updating the negative-charged particle density of each cell; and repeatedly executing the electrostatic field analysis process, the increasing process, the reduction process, the negative-charged particle emission process, and the advection process.

2 Claims, 14 Drawing Sheets

(56) References Cited

OTHER PUBLICATIONS

Zheng Quanfu et al: "Hybrid Simulation Method for EM Wave Generation and Propagation of Streamer Discharges", IEEE Transactions on Dielectrics and Electrical Insulation, IEEE Service Center, Piscataway, NJ, US, vol. 28, No. 6, Dec. 1, 2021, pp. 2018-2026.

Wenxia Sima et al: "Study of the Characteristics of a Streamer Discharge in Air Based on a Plasma Chemical Model", IEEE Transactions on Dielectrics and Electrical Insulation, IEEE Service Center, Piscataway, NJ, US, vol. 19, No. 2, Apr. 1, 2012, pp. 660-670.

* cited by examiner

ANALYSIS METHOD

CROSS-REFERENCE TO RELATED APPLICATIONS

The present application claims priority from Japanese Patent Application No. 2024-007040 filed on Jan. 19, 2024, the entire contents of which are hereby incorporated by reference.

The present disclosure relates to an analysis method for analyzing discharge occurred in a space.

For example, Japanese Unexamined Patent Application Publication (JP-A) No. 2021-133860 discloses that a lightning strike may occur on an aircraft in flight. In JP-A No. 2021-133860, an electric field sensor is provided in each part of an aircraft body, a distribution of a surface electric field strength of the aircraft is derived based on a detection result of the electric field sensor, and an attitude control of the aircraft is executed using the distribution of the surface electric field strength, thereby preventing an influence of the lightning strike.

SUMMARY

An aspect of the disclosure provides an analysis method for analyzing discharge occurred in a space between a first electrode and a second electrode. The analysis method includes: dividing an analysis space in which an electrostatic field analysis is executed into cells; setting, to the cells in the analysis space, a negative-charged particle density indicating how many negative-charged particles have a negative charge in one cell and a positive-charged particle density indicating how many positive-charged particles have a positive charge in one cell; arranging the first electrode and the second electrode in the analysis space, setting a first potential to the first electrode, and setting a second potential to the second electrode; executing an electrostatic field analysis process of deriving an electric field strength for each cell in the analysis space by an electrostatic field analysis to acquire an electric field strength distribution in the analysis space; executing an increasing process of increasing, by a predetermined first coefficient, the negative-charged particle density and the positive-charged particle density of a cell that satisfies a condition that the electric field strength exceeds a predetermined first electric field threshold and the positive-charged particle density is equal to or less than a predetermined upper limit value among the cells in the analysis space; executing a reduction process of reducing the negative-charged particle density and the positive-charged particle density of each of the cells in the analysis space by each predetermined second coefficient, executing a negative-charged particle emission process of increasing, in a case where an electric field strength of a surface of one electrode of the first electrode and the second electrode which has a lower set potential exceeds a predetermined second electric field threshold, the negative-charged particle density of a cell around the surface in the analysis space by a predetermined third coefficient; executing an advection process of updating the negative-charged particle density of each cell by moving the negative-charged particles of each cell in the analysis space based on the electric field strength distribution in the analysis space; and repeatedly executing the electrostatic field analysis process, the increasing process, the reduction process, the negative-charged particle emission process, and the advection process.

BRIEF DESCRIPTION OF DRAWINGS

The accompanying drawings are included to provide a further understanding of the disclosure and are incorporated in and constitute a part of this specification. The drawings illustrate an embodiment and, together with the specification, serve to describe the principles of the disclosure.

DETAILED DESCRIPTION

In various electric devices including an aircraft, discharge may occur in a space due to each part of the electric device depending on a shape of each part of the electric device, a gap length between respective parts, or the like. There is a demand for a technique for assisting in designing an electric device that does not cause such discharge.

The present disclosure provides an analysis method capable of analyzing discharge occurred in a space.

Hereinafter, an embodiment of the present disclosure will be described in detail with reference to the accompanying drawings. Specific dimensions, materials, numerical values, and the like illustrated in the embodiments are merely examples for facilitating the understanding of the disclosure, and do not limit the present disclosure unless otherwise specified. In the present description and the drawings, elements having substantially the same functions and configurations are denoted by the same reference signs, and a repeated description thereof is omitted, and elements having no direct relation with the present disclosure are omitted.

As an example of a theoretical description of discharge, a streamer theory has been proposed. An outline of the streamer theory will be described below.

FIGS. 1 to 4 are explanatory diagrams illustrating, in a deformed manner, occurrence processes of discharge in streamer theory. In FIGS. 1 to 4, a first electrode 10 is a rod-shaped electrode, and a second electrode 12 is a plate-shaped electrode. The first electrode 10 and the second electrode 12 are separated, and a space is present between the first electrode 10 and the second electrode 12. In examples of FIGS. 1 to 4, the first electrode 10 is assumed to be a negative electrode and the second electrode 12 is assumed to be a positive electrode.

The first electrode 10 and the second electrode 12 are coupled to a power supply, and a potential difference is applied between the first electrode 10 and the second electrode 12 such that the first electrode 10 becomes the negative electrode and the second electrode 12 becomes the positive electrode. Thus, an electrostatic field is generated in the space between the first electrode 10 and the second electrode 12. Since the first electrode 10 has a rod shape, an electric field is concentrated at a tip portion of the first electrode 10 on a second electrode 12 side, and an electric field strength becomes strong.

Figure 1:
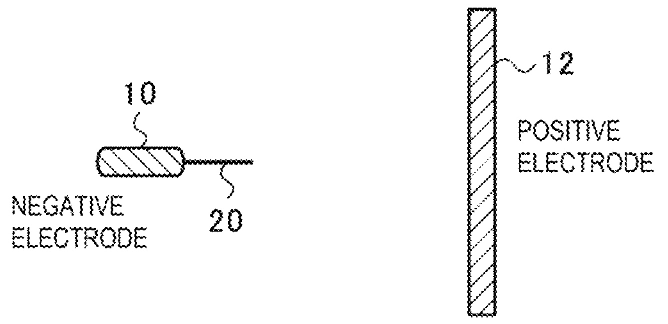
FIG. 1 is an explanatory diagram illustrating, in a deformed manner, an occurrence process of discharge in streamer theory.

As illustrated in FIG. 1, when the potential difference between the first electrode 10 and the second electrode 12 is increased, due to the strong electric field of the tip portion of the first electrode 10, air around the tip portion causes an electrical breakdown, and a string-shaped streamer 20 is generated from the tip portion of the first electrode 10 which is the negative electrode.

Figure 2:
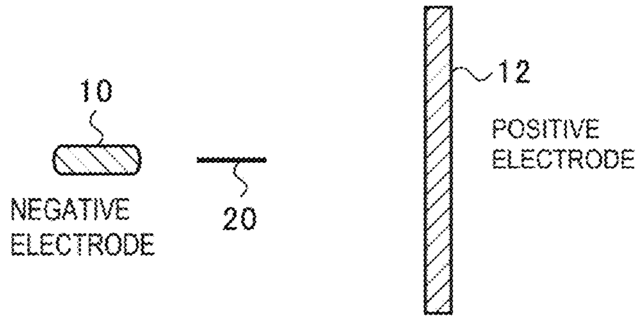
FIG. 2 is an explanatory diagram illustrating, in a deformed manner, an occurrence process of discharge in streamer theory.

As illustrated in FIG. 2, the streamer 20 appears to fly from the first electrode 10 which is the negative electrode toward the second electrode 12 which is the positive electrode.

Figure 3:
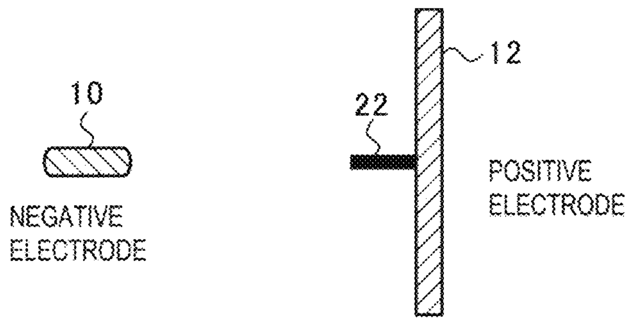
FIG. 3 is an explanatory diagram illustrating, in a deformed manner, an occurrence process of discharge in streamer theory.

When the streamer 20 reaches the second electrode 12, as illustrated in FIG. 3, a leader 22 that appears following the streamer 20 is generated from the second electrode 12 which is the positive electrode. Hereinafter, the generation of the leader 22 may be referred to as a leader change.

Figure 4:
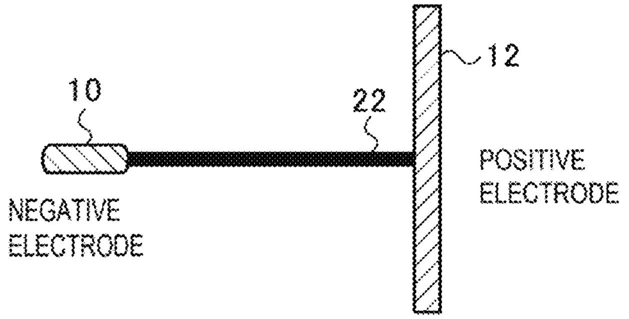
FIG. 4 is an explanatory diagram illustrating, in a deformed manner, an occurrence process of discharge in streamer theory.

As illustrated in FIG. 4, the leader 22 extends from the second electrode 12 which is the positive electrode toward the first electrode 10 which is the negative electrode, and reaches the first electrode 10 which is the negative electrode. When the leader 22 reaches the first electrode 10, a large current flows between the first electrode 10 and the second electrode 12, leading to discharge.

FIGS. 5 to 8 are other explanatory diagrams illustrating, in a deformed manner, occurrence processes of discharge in streamer theory. In examples of FIGS. 5 to 8, the first electrode 10 is assumed to be the positive electrode and the second electrode 12 is assumed to be the negative electrode. Also in the examples, an electric field is concentrated at the tip portion of the first electrode 10 on the second electrode 12 side, and the electric field strength becomes strong.

Figure 5:
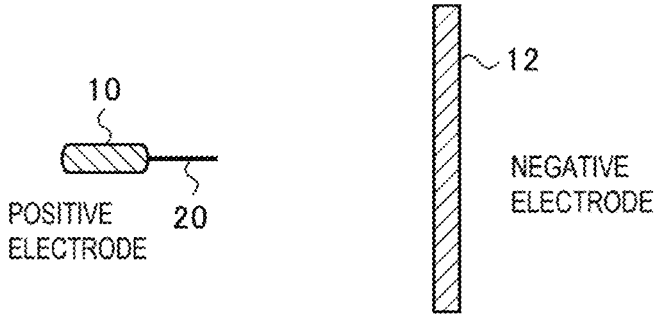
FIG. 5 is another explanatory diagram illustrating, in a deformed manner, an occurrence process of discharge in streamer theory.

As illustrated in FIG. 5, when the potential difference between the first electrode 10 and the second electrode 12 is increased, due to the strong electric field of the tip portion of the first electrode 10, air around the tip portion causes an electrical breakdown, and a string-shaped streamer 20 is generated from the tip portion of the first electrode 10 which is the positive electrode.

Figure 6:
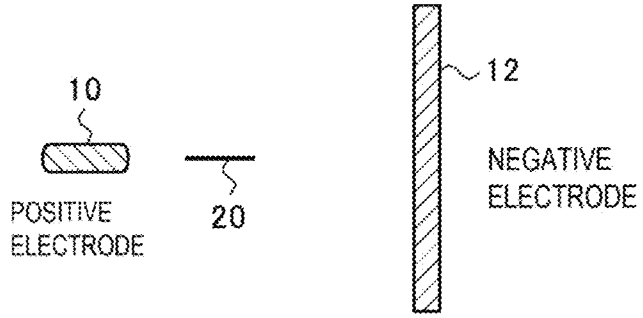
FIG. 6 is another explanatory diagram illustrating, in a deformed manner, an occurrence process of discharge in streamer theory.

As illustrated in FIG. 6, the streamer 20 appears to fly from the first electrode 10 which is the positive electrode toward the second electrode 12 which is the negative electrode.

Figure 7:
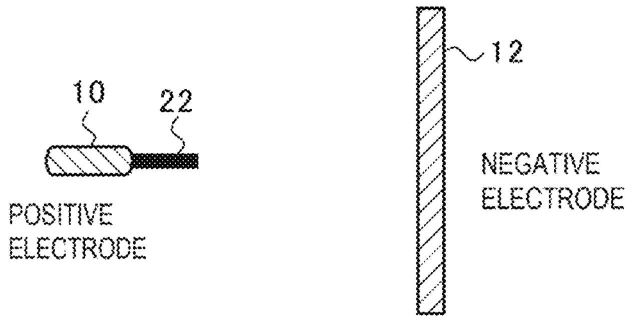
FIG. 7 is another explanatory diagram illustrating, in a deformed manner, an occurrence process of discharge in streamer theory.

When the streamer reaches the second electrode 12, as illustrated in FIG. 7, a leader 22 that appears following the streamer 20 is generated from the first electrode 10 which is the positive electrode. As described above, in a case where the first electrode 10 is the positive electrode, a leader change occurs in the first electrode 10 which is the positive electrode.

Figure 8:
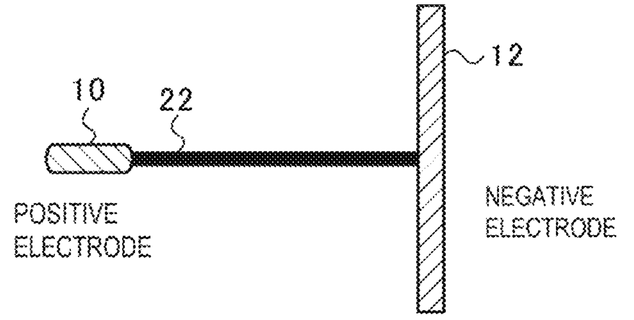
FIG. 8 is another explanatory diagram illustrating, in a deformed manner, an occurrence process of discharge in streamer theory.

As illustrated in FIG. 8, the leader 22 extends from the first electrode 10 which is the positive electrode toward the second electrode 12 which is the negative electrode, and reaches the second electrode 12 which is the negative electrode. When the leader 22 reaches the second electrode 12, a large current flows between the first electrode 10 and the second electrode 12, leading to discharge.

Here, in order to further understand under which condition such discharge occurs, an analysis method for analyzing the discharge is desired.

Therefore, in the present embodiment, an analysis method for analyzing discharge occurred in the space between the first electrode 10 and the second electrode 12 is disclosed. By using the analysis method of the present embodiment, it is possible to estimate whether discharge caused by each part of an electric device occurs in a space based on a shape of each part of the electric device, a gap length between respective parts, or the like.

Figure 9:
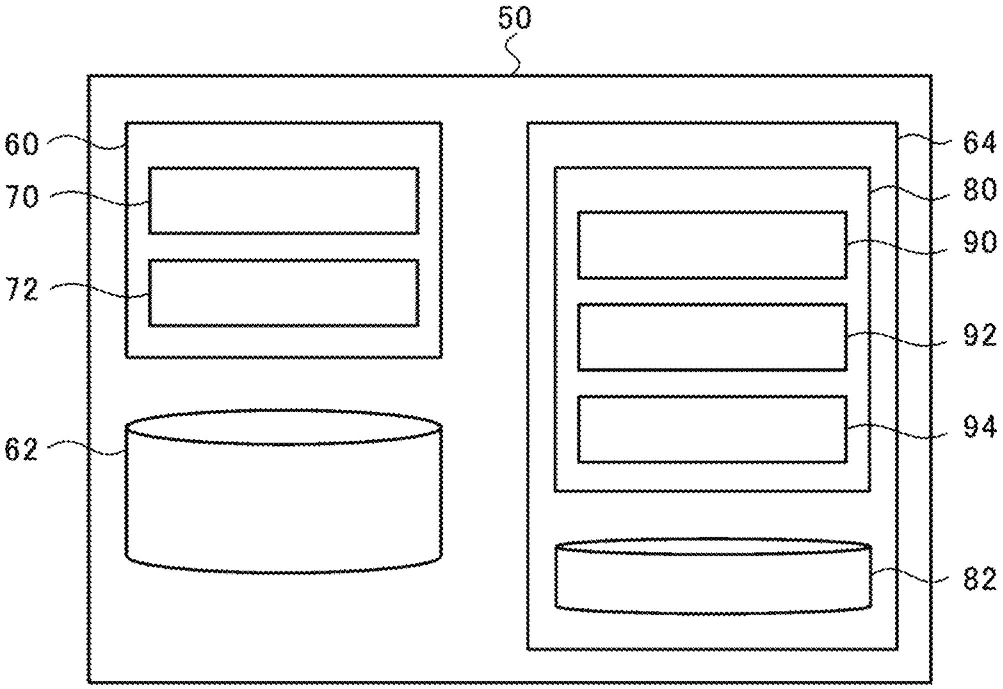
FIG. 9 is a schematic diagram illustrating a configuration of an analysis device for implementing an analysis method of the present embodiment.

FIG. 9 is a schematic diagram illustrating a configuration of an analysis device 50 for implementing the analysis method of the present embodiment. The analysis device 50 is, for example, a computer such as a personal computer. The analysis device 50 includes a user interface 60, a storage device 62, and an arithmetic device 64.

The user interface 60 includes a display device 70 and an input device 72. The display device 70 is, for example, a liquid crystal display or an organic EL display, and displays various kinds of images and information. In addition to the display device 70, the user interface 60 may include an output device that presents various kinds of information to a user, such as a speaker. The input device 72 includes, for example, a keyboard or a mouse, and receives an input operation of the user.

The storage device 62 includes a nonvolatile storage element. The storage device 62 may be formed by a nonvolatile storage element such as a flash memory that can be electrically read and written. The storage device 62 stores various kinds of data used for various processes to be executed by the analysis device 50.

The arithmetic device 64 includes one or a plurality of processors 80 and one or a plurality of memories 82 coupled to the processors 80. The memory 82 includes a ROM, in which programs and the like are stored, and a RAM serving as a work area. The processor 80 executes various processes in cooperation with a program included in the memory 82. The processor 80 also serves as an analysis preprocessing unit 90, an analysis execution processing unit 92, and a determination processing unit 94 by executing a program.

The analysis preprocessing unit 90 executes preprocessing for executing an analysis execution process by the analysis execution processing unit 92. After the preprocessing is executed, the analysis execution processing unit 92 executes an analysis execution process. The analysis execution process is a process of executing analysis of an occurrence process of discharge. After the analysis execution process is executed, the determination processing unit 94 determines whether discharge occurs using a result of the analysis execution process.

Here, with reference to the above-described streamer theory, the inventors independently interpreted and modeled the occurrence process of discharge. Then, the inventors constructed an analysis method for analyzing an occurrence process of discharge based on a modeled content thereof. Hereinafter, first, the content of modeling by the inventors will be described, and then the preprocessing, the analysis execution process, and the determination process according to the analysis method of the present embodiment will be described in detail.

FIGS. 10 to 14 are diagrams illustrating contents in which a phenomenon around the tip portion of the first electrode 10 as a negative electrode is modeled. In FIGS. 10 to 14, black solid circles indicate negative-charged particles n having a negative charge, and circles marked with "+" indicate positive-charged particles p having a positive charge. Arrows in FIGS. 11 to 14 illustrate a movement direction of the negative-charged particles n. The negative-charged particles n are assumed to be particles having a negative elementary charge, and physically correspond to, for example, electrons. The positive-charged particles n are assumed to be particles having a positive charge, and physically correspond to, for example, ions.

Figure 10:
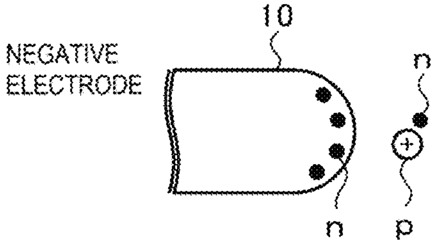
FIG. 10 is a diagram illustrating a content in which a phenomenon around a tip portion of a first electrode as a negative electrode is modeled.

The atmosphere is filled with a gas which is an example of neutral particles exhibiting neutrality. Since the electric field is concentrated at the tip portion of the first electrode 10, the electric field strength becomes strong. As illustrated in FIG. 10, in the vicinity of the tip portion of the first electrode 10, the gas in the atmosphere is ionized into electrons having a negative charge and ions having a positive charge due to the strong electric field strength. That is, the negative-charged particles n and the positive-charged particles p are generated in the vicinity of the tip portion of the first electrode 10.

Figure 11:
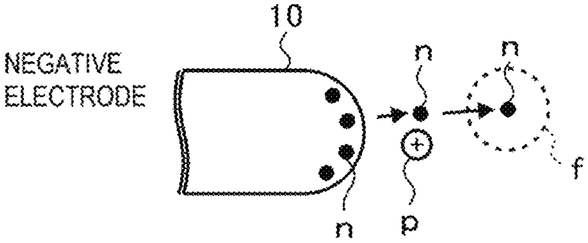
FIG. 11 is a diagram illustrating a content in which a phenomenon around the tip portion of the first electrode as a negative electrode is modeled.

As illustrated in FIG. 11, in this model, the negative-charged particles n generated by the ionization are assumed to move at constant mobility in a direction from the first electrode 10 toward the second electrode 12 due to an influence of an electric field strength distribution in the space between the first electrode 10 and the second electrode 12. On the other hand, the positive-charged particles p generated by the ionization are assumed to remain at positions where the positive-charged particles p are generated and do not move. This is because a mass of ions corresponding to the positive-charged particles p is larger than that of electrons corresponding to the negative-charged particles n, and mobility of the ions is extremely smaller than mobility of the electrons, and thus it can be considered that the ions do not move during an extremely short time of less than a microsecond during which simulation is executed.

In addition, the negative-charged particles n are present in the first electrode 10 which is a negative electrode. As illustrated in FIG. 11, it is assumed that the negative-charged particles n are emitted from the first electrode 10 to the atmosphere based on the electric field strength of a surface of the first electrode 10 which is the negative electrode.

Figure 12:
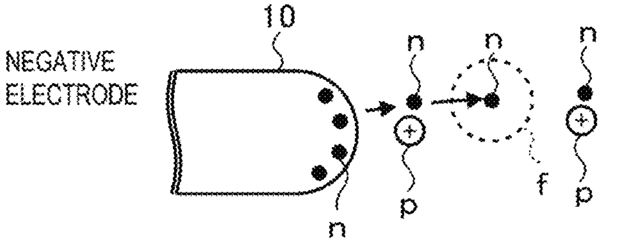
FIG. 12 is a diagram illustrating a content in which a phenomenon around the tip portion of the first electrode as a negative electrode is modeled.

As illustrated in FIG. 11, the moved negative-charged particle n generates an electric field f at a destination of the movement as indicated by a broken line circle. That is, an ionization region, which is a region that is ionized, grows from the first electrode 10 toward the second electrode 12. The gas is ionized into electrons and ions by electrons accelerated in the grown ionization region, electromagnetic waves caused by recombination of the gas already ionized, and the like. Accordingly, as illustrated in FIG. 12, the negative-charged particles n and the positive-charged particles p are generated, and the ionization region is expanded.

Figure 13:
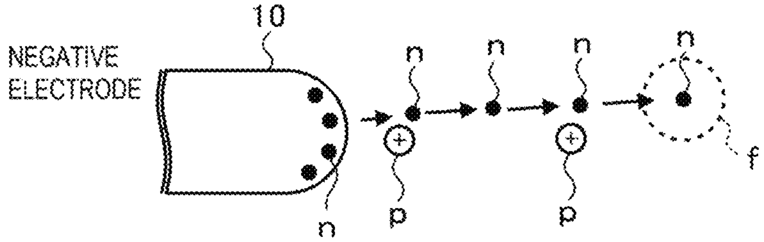
FIG. 13 is a diagram illustrating a content in which a phenomenon around the tip portion of the first electrode as a negative electrode is modeled.
Figure 14:
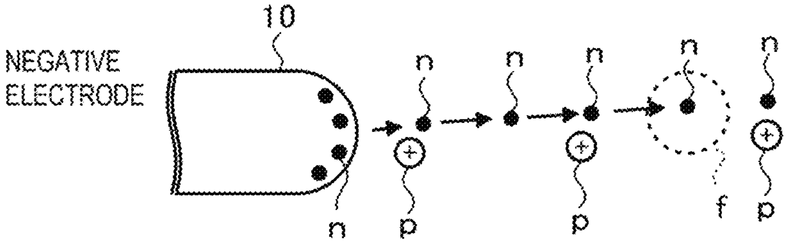
FIG. 14 is a diagram illustrating a content in which a phenomenon around the tip portion of the first electrode as a negative electrode is modeled.

As illustrated in FIG. 13, the negative-charged particles n in the space further move in the direction from the first electrode 10 toward the second electrode 12 due to the influence of the electric field strength distribution in the space. The moved negative-charged particle n generates an electric field f at a movement destination, and the ionization region further grows. The gas is ionized into electrons and ions by electrons accelerated in the grown ionization region, electromagnetic waves caused by recombination of the gas already ionized, and the like. Accordingly, as illustrated in FIG. 14, the negative-charged particles n and the positive-charged particles p are generated, and the ionization region is expanded.

In this manner, it is considered that the negative-charged particles n and the positive-charged particles p are generated and the negative-charged particles n move to grow the ionization region. In this case, the positive-charged particles p are gradually generated from the first electrode 10 toward the second electrode 12. Therefore, a progress of the streamer 20 is modeled by the positive-charged particles p gradually generated from the first electrode 10 toward the second electrode 12.

FIGS. 15 to 20 are diagrams illustrating contents in which a phenomenon around the second electrode 12 as a positive electrode is modeled. FIGS. 15 to 20 illustrate states in which the positive-charged particles p are arranged from the first electrode 10 toward the second electrode 12. Arrows in FIGS. 15 to 20 illustrate a movement direction of the negative-charged particles n.

Figure 15:
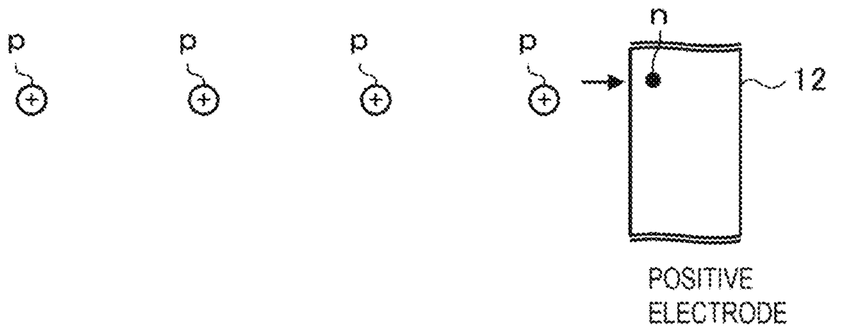
FIG. 15 is a diagram illustrating a content in which a phenomenon around a second electrode as a positive electrode is modeled.
Figure 16:
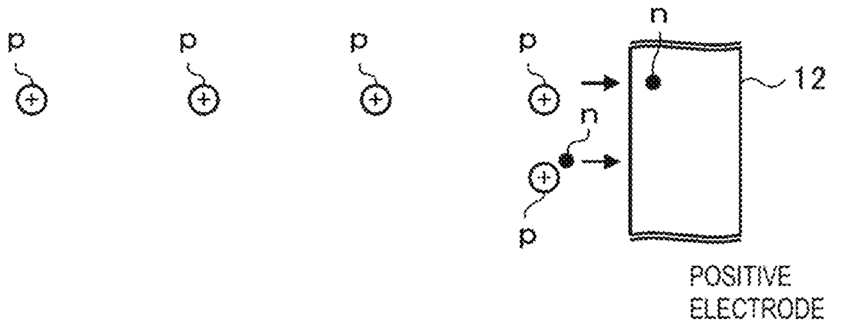
FIG. 16 is a diagram illustrating a content in which a phenomenon around the second electrode as a positive electrode is modeled.

As illustrated in FIG. 15, the negative-charged particles n that have moved through the space enter the second electrode 12 which is the positive electrode, and the electric field strength in the vicinity of the second electrode 12 becomes strong. Thus, as illustrated in FIG. 16, the gas in the atmosphere is ionized into electrons and ions in the vicinity of the second electrode 12. It is assumed that the negative-charged particles n generated by the ionization move toward the second electrode 12. On the other hand, the positive-charged particles p generated by the ionization are assumed to remain at positions where the positive-charged particles p are generated and do not move because of the above-described mass and mobility of the ions, and the like.

Figure 17:
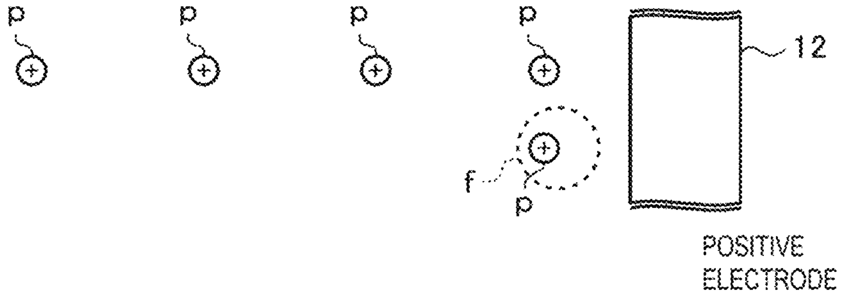
FIG. 17 is a diagram illustrating a content in which a phenomenon around the second electrode as a positive electrode is modeled.
Figure 18:
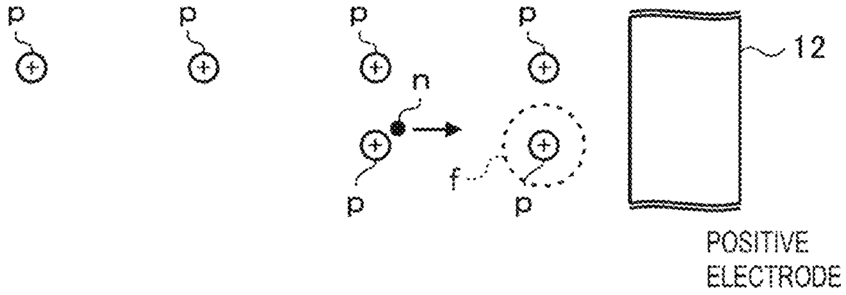
FIG. 18 is a diagram illustrating a content in which a phenomenon around the second electrode as a positive electrode is modeled.

When the generated negative-charged particles n move into the second electrode 12, as illustrated in FIG. 17, an electric field f having a strong electric field strength is generated by the positive-charged particles p that are generated and do not move. Due to the electric field f, as illustrated in FIG. 18, gas on a first electrode 10 side is ionized into electrons and ions, and negative-charged particles n and positive-charged particles p are further generated. The generated negative-charged particles n move toward the second electrode 12.

Figure 19:
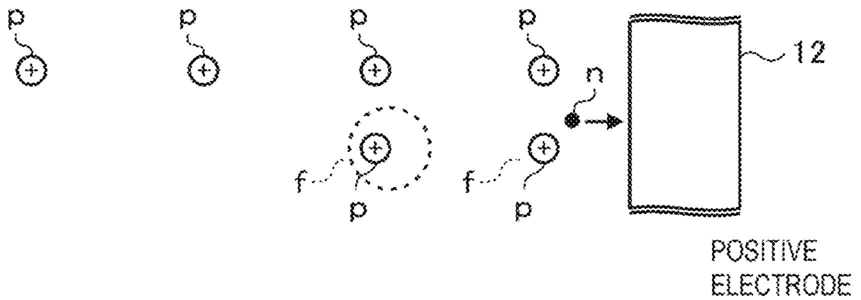
FIG. 19 is a diagram illustrating a content in which a phenomenon around the second electrode as a positive electrode is modeled.
Figure 20:
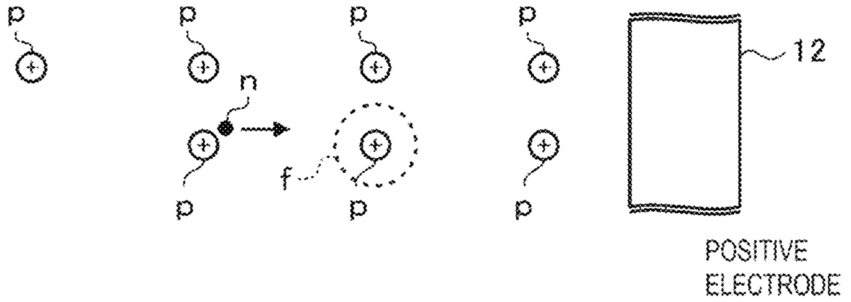
FIG. 20 is a diagram illustrating a content in which a phenomenon around the second electrode as a positive electrode is modeled.

As illustrated in FIG. 19, when the negative-charged particles n move, an electric field f having a strong electric field strength is generated by the positive-charged particles p that are generated and do not move in FIG. 18. That is, the ionization region grows from the second electrode 12 toward the first electrode 10, as if the second electrode 12, which is the positive electrode, extends toward the first electrode 10 side. Then, due to the grown ionization region, as illustrated in FIG. 20, the gas on the first electrode 10 side is ionized into electrons and ions, and the negative-charged particles n and the positive-charged particles p are further generated.

In this manner, it is considered that the negative-charged particles n and the positive-charged particles p are generated and the negative-charged particles n move to grow the ionization region. In this case, the positive-charged particles p are gradually generated from the second electrode 12 toward the first electrode 10. Therefore, a progress of the leader 22 is modeled by the positive-charged particles p gradually generated from the second electrode 12 toward the first electrode 10.

FIGS. 21 to 25 are diagrams illustrating contents in which a phenomenon around the tip portion of the first electrode 10 as a positive electrode is modeled. Arrows in FIGS. 21 to 25 illustrate a movement direction of the negative-charged particles n.

Figure 21:
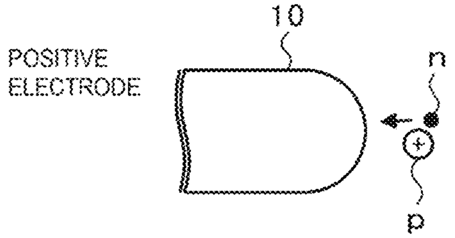
FIG. 21 is a diagram illustrating a content in which a phenomenon around a tip portion of a first electrode as a positive electrode is modeled.

Since the electric field is concentrated at the tip portion of the first electrode 10, the electric field strength becomes strong. As illustrated in FIG. 21, in the vicinity of the tip portion of the first electrode 10, the gas in the atmosphere is ionized into electrons and ions due to the strong electric field strength, and the negative-charged particles n and the positive-charged particles p are generated.

Figure 22:
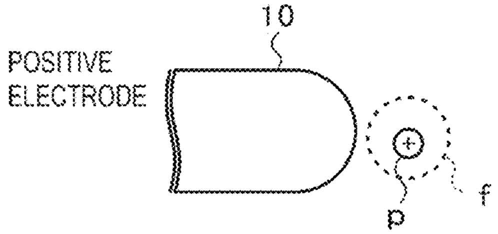
FIG. 22 is a diagram illustrating a content in which a phenomenon around the tip portion of the first electrode as a positive electrode is modeled.

As illustrated in FIG. 21, it is assumed that the negative-charged particles n generated by the ionization move toward the first electrode 10 which is the positive electrode and enter the first electrode 10. On the other hand, the positive-charged particles p generated by the ionization are assumed to remain at positions where the positive-charged particles p are generated and do not move because of the above-described mass and mobility of the ions, and the like. Thus, as illustrated in FIG. 22, an electric field f is generated by the positive-charged particles p that are generated and do not move. That is, the ionization region grows from the first electrode 10 toward the second electrode 12, as if the first electrode 10, which is the positive electrode, extends toward the second electrode 12 side.

Figure 23:
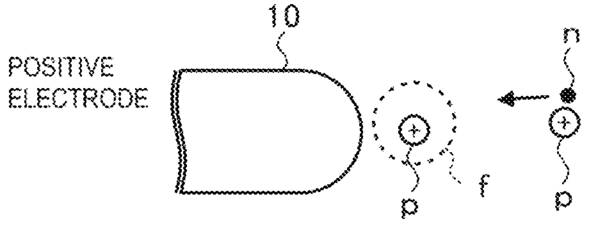
FIG. 23 is a diagram illustrating a content in which a phenomenon around the tip portion of the first electrode as a positive electrode is modeled.

Due to the ionization region grown as illustrated in FIG. 22, as illustrated in FIG. 23, gas on the second electrode 12 side is ionized into electrons and ions, and the negative-charged particles n and the positive-charged particles p are further generated. The generated negative-charged particles n move toward the first electrode 10 which is the positive electrode. Thus, as illustrated in FIG. 24, an electric field f is generated by the positive-charged particles p that are generated and do not move, and the ionization region grows.

Figure 24:
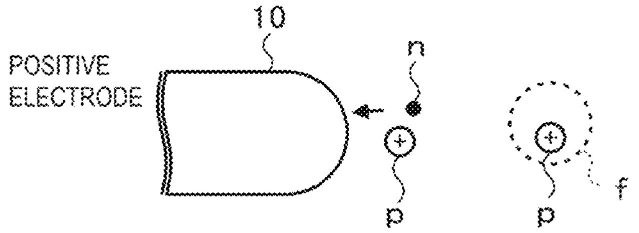
FIG. 24 is a diagram illustrating a content in which a phenomenon around the tip portion of the first electrode as a positive electrode is modeled.
Figure 25:
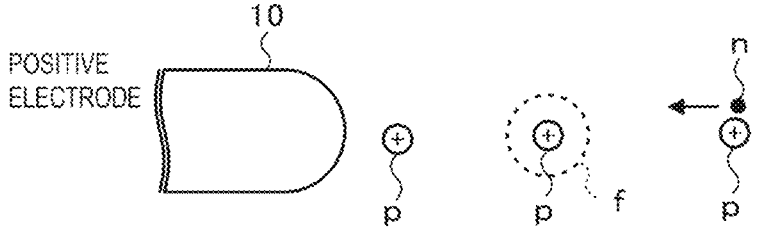
FIG. 25 is a diagram illustrating a content in which a phenomenon around the tip portion of the first electrode as a positive electrode is modeled.

Due to the ionization region grown as illustrated in FIG. 24, as illustrated in FIG. 25, the gas on the second electrode 12 side is ionized into electrons and ions, and the negative-charged particles n and the positive-charged particles p are further generated.

In this manner, it is considered that the negative-charged particles n and the positive-charged particles p are generated and the negative-charged particles n move to grow the ionization region. In this case, the positive-charged particles p are gradually generated from the first electrode 10 toward the second electrode 12. Therefore, a progress of the streamer 20 is modeled by the positive-charged particles p gradually generated from the first electrode 10 toward the second electrode 12.

Regarding the progress of the leader 22 from the first electrode 10 considered as the positive electrode, similarly to the description with reference to FIGS. 21 to 25, modeling is executed with the positive-charged particles p gradually generated from the first electrode 10 toward the second electrode 12.

Figure 26:
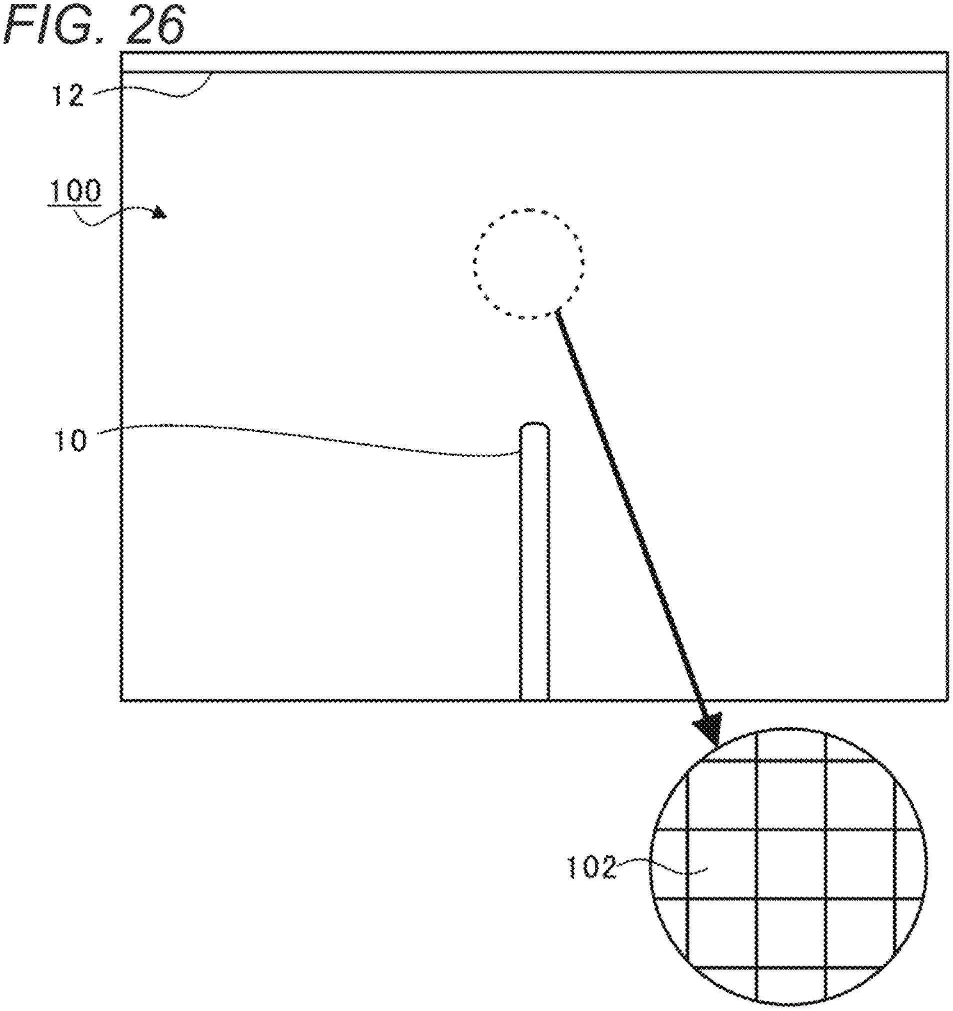
FIG. 26 is a diagram illustrating an analysis space.

FIG. 26 is a diagram illustrating an analysis space 100. The analysis space 100 is a virtual space for executing an electrostatic field analysis. The analysis space 100 is large enough to execute a sufficient electrostatic field analysis.

For example, the first electrode 10 is set near the center of the analysis space 100. The first electrode 10 is set as, for example, a bar electrode having a length of about 30 cm. A size of the first electrode 10 is not limited to an illustrated size, and may be set to any size. For example, the second electrode 12 is set in an upper portion of the analysis space 100. The second electrode 12 is set as a plate electrode extending in a planar shape in a left-right direction in FIG. 26. A length of the second electrode 12 in the left-right direction is sufficiently longer than a diameter of the first electrode 10. The first electrode 10 and the second electrode 12 are disposed to be separated from each other. A distance between the first electrode 10 and the second electrode 12 is set to, for example, about 80 cm, but may be set to any value.

A first potential is set to the first electrode 10, and a second potential is set to the second electrode 12. For example, the first potential is a negative potential, and the second potential is a positive potential. In addition, the first potential may be a positive potential, and the second potential may be a negative potential. Further, the first potential may be a ground potential, and the second potential may be a positive potential or a negative potential. By setting the potentials of the first electrode 10 and the second electrode 12, an electrostatic field can be generated between the first electrode 10 and the second electrode 12.

The analysis space 100 is divided into a plurality of cells 102. The cell 102 is, for example, a rectangular region of a predetermined size. A size of the cell 102 is set to, for example, 10 mm on each side, but may be set to any size that allows analysis to be executed appropriately. In the analysis space 100, the plurality of cells 102 are arranged over the entire analysis space 100. In other words, the analysis space 100 is divided into meshes by the plurality of cells 102. FIG. 26 illustrates the cells 102 by enlarging a portion of the analysis space 100.

Here, the above-described model focusing on the generation of the negative-charged particles n and the positive-charged particles p and the movement of the negative-charged particles n is developed using the cells 102 of the analysis space 100.

FIGS. 27 to 31 are diagrams illustrating states of the negative-charged particles n and the positive-charged particles p in the cells 102. FIGS. 27 to 31 illustrate two cells 102 of a cell 102*a* and a cell 102*b* among the plurality of cells 102 for convenience of description. The cell 102*a* and the cell 102*b* are adjacent to each other.

Here, the number of negative-charged particles n in one cell is defined as a negative-charged particle density, and the number of positive-charged particles p in one cell is defined as a positive-charged particle density.

Figure 27:
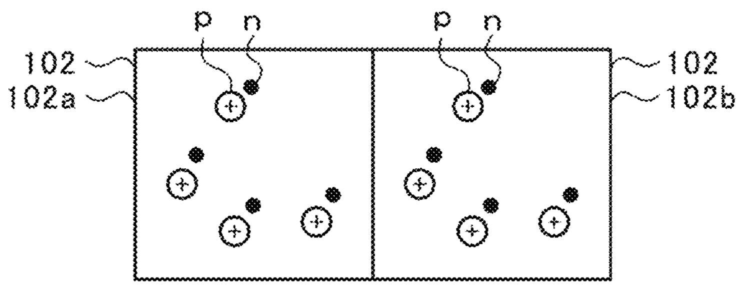
FIG. 27 is a diagram illustrating states of electrons and ions in a cell.

For example, due to an influence of a strong electric field strength of the tip portion of the first electrode 10, as illustrated in FIG. 27, it is assumed that gas in the cell 102*a* and the cell 102*b* is ionized and the negative-charged particles n and the positive-charged particles p are generated in the cell 102*a* and the cell 102*b*, respectively. In this case, a negative-charged particle density and a positive-charged particle density in the cell 102*a*, as well as a negative-charged particle density and a positive-charged particle density in the cell 102*b* are increased as compared to those before the ionization.

Figure 28:
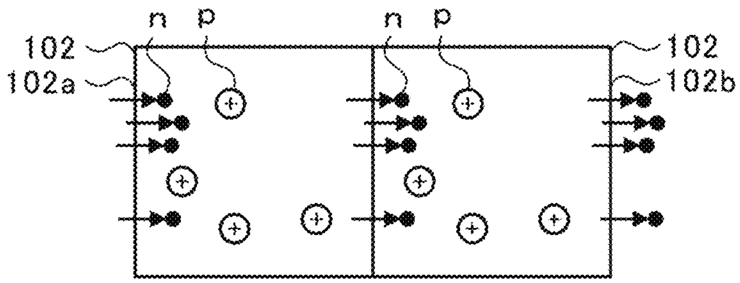
FIG. 28 is a diagram illustrating states of the electrons and the ions in the cell.

As illustrated in FIG. 28, it is assumed that the negative-charged particles n in the cell 102*a* move to the cell 102*b* based on an electric field strength distribution around the cell 102*a*. A speed at which the negative-charged particles n in the cell 102*a* move to the cell 102*b* depends on the electric field strength distribution around the cell 102*a*. Hereinafter, the movement of the negative-charged particles n between the cells 102 may be referred to as advection, and a speed of the advection of the negative-charged particles n may be referred to as an advection speed.

As illustrated in FIG. 28, negative-charged particles n are advected into the cell 102*a* from a cell 102 (not illustrated) adjacent to the cell 102*a*. In addition, as illustrated in FIG. 28, the negative-charged particles n in the cell 102*b* are advected to a cell 102 (not illustrated) adjacent to the cell 102*b*.

As described above, regarding the advection of the negative-charged particles n, the negative-charged particle density in the cell 102*a* changes to a negative-charged particle density indicated by a difference value between negative-charged particles n entering the cell 102*a* and negative-charged particles n exiting the cell 102*a*. Similarly, regarding the advection of the negative-charged particles n, the negative-charged particle density in the cell 102*b* changes to a negative-charged particle density indicated by a difference value between negative-charged particles n entering the cell 102*b* and negative-charged particles n exiting the cell 102*b*.

On the other hand, as illustrated in FIG. 28, the positive-charged particles p in the cell 102*a* remain in the cell 102*a*, and the positive-charged particles p in the cell 102*b* remain in the cell 102*b*.

As described above, even when the negative-charged particles n are advected, the positive-charged particles p do not move. Therefore, the positive-charged particle density in the cell 102*a* does not change with respect to the advection of the negative-charged particles n. Similarly, the positive-charged particle density in the cell 102*b* does not change with respect to the advection of the negative-charged particles n.

In FIG. 28, it is assumed that the negative-charged particles n advected from the cell 102*a* into the cell 102*b* collide with neutral particles present in the cell 102*b*. The neutral particles may simulate any gas in the atmosphere, for example.

Figure 29:
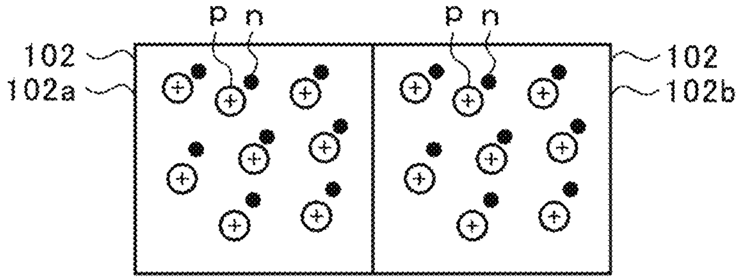
FIG. 29 is a diagram illustrating states of the electrons and the ions in the cell.

When the negative-charged particles n collide with the neutral particles in the cell 102*b*, the neutral particles are ionized by a collision energy thereof, and as illustrated in FIG. 29, negative-charged particles n and positive-charged particles p caused by the neutral particles are generated in the cell 102*b*. Thus, as illustrated in FIG. 29, the negative-charged particle density and the positive-charged particle density in the cell 102*b* are increased as compared to the negative-charged particle density and the positive-charged particle density in the cell 102*b* of FIG. 28 before the ionization of the neutral particles.

Similarly, in FIG. 28, it is assumed that the negative-charged particles n advected into the cell 102*a* collide with neutral particles present in the cell 102*a*.

When the negative-charged particles n collide with the neutral particles in the cell 102*a*, the neutral particles are ionized by a collision energy thereof, and as illustrated in FIG. 29, negative-charged particles n and positive-charged particles p caused by the neutral particles are generated in the cell 102*a*. Thus, as illustrated in FIG. 29, the negative-charged particle density and the positive-charged particle density in the cell 102*a* are increased as compared to the negative-charged particle density and the positive-charged particle density in the cell 102*a* before the ionization of the neutral particles.

As described above, due to the ionization caused by the advection of the negative-charged particles n, the negative-charged particle density and the positive-charged particle density in each cell 102 are increased. An increase rate of the negative-charged particle density and an increase rate of the positive-charged particle density of each cell 102 due to this factor may be set to values according to the electric field strength of the cell 102.

In addition, it is assumed that when there is a pair of the negative-charged particle n and the positive-charged particle p in the cell 102 by simulating recombination of electrons and ions, the negative-charged particle n and the positive-charged particle p may recombine. When recombined, the negative-charged particle n and the positive-charged particle p subjected to the recombination disappear.

Figure 30:
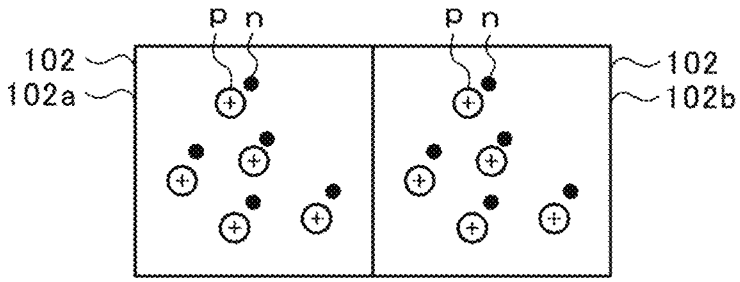
FIG. 30 is a diagram illustrating states of the electrons and the ions in the cell.

When the negative-charged particles n and the positive-charged particles p in the cell 102*a* recombine at a predetermined ratio, as illustrated in FIG. 30, the negative-charged particle density and the positive-charged particle density in the cell 102*a* are reduced as compared to the negative-charged particle density and the positive-charged particle density in the cell 102*a* before the recombination.

Similarly, when the negative-charged particles n and the positive-charged particles p in the cell 102*b* recombine at a predetermined ratio, as illustrated in FIG. 30, the negative-charged particle density and the positive-charged particle density in the cell 102*b* are reduced as compared to the negative-charged particle density and the positive-charged particle density in the cell 102*b* before the recombination.

As described above, due to the recombination, the negative-charged particle density and the positive-charged particle density in each cell 102 are reduced. A reduction rate of the negative-charged particle density and a reduction rate of the positive-charged particle density of each cell 102 due to this factor may be set to specific values in advance regardless of the electric field strength.

In addition, it is assumed that ionization due to an electromagnetic wave caused by the recombination of electrons and ions is simulated, and neutrons in the cell 102 are ionized at a predetermined ratio to generate negative-charged particles n and positive-charged particles p in the cell 102.

Figure 31:
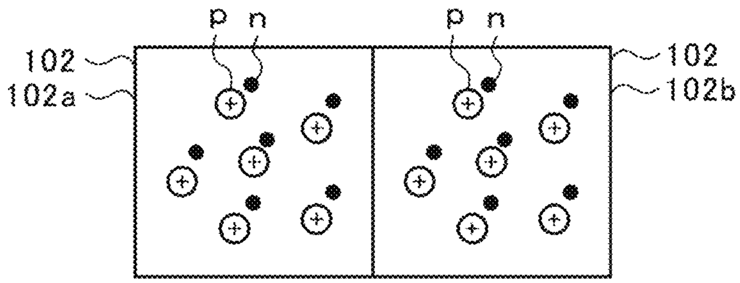
FIG. 31 is a diagram illustrating states of the electrons and the ions in the cell.

When the neutrons in the cell 102*a* are ionized at a predetermined ratio due to the electromagnetic wave, the negative-charged particle density and the positive-charged particle density in the cell 102*a* are increased as illustrated in FIG. 31.

Similarly, when the neutrons in the cell 102*b* are ionized at a predetermined ratio due to the electromagnetic wave, the negative-charged particle density and the positive-charged particle density in the cell 102*b* are increased as illustrated in FIG. 31.

As described above, due to the ionization caused by the electromagnetic wave, the negative-charged particle density and the positive-charged particle density in each cell 102 are increased. An increase rate of the negative-charged particle density and an increase rate of the positive-charged particle density of each cell 102 due to this factor may be set to values according to the electric field strength of the cell 102.

Consequently, in each cell 102 in the analysis space 100, an occurrence process of discharge can be analyzed by deriving a transition of the negative-charged particle density and the positive-charged particle density. Hereinafter, details of each process in the analysis device 50 that implements the analysis method of the present embodiment will be described.

Figure 32:
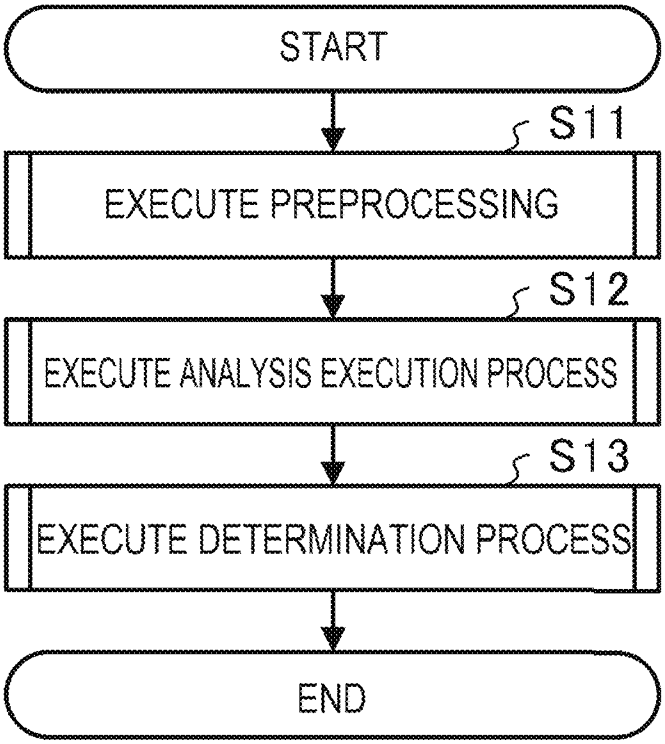
FIG. 32 is a flowchart illustrating an operation of an arithmetic device.

FIG. 32 is a flowchart illustrating an operation of the arithmetic device 64. For example, the analysis preprocessing unit 90 of the arithmetic device 64 executes preprocessing (S11) when receiving a preprocessing start signal instructing a start of the preprocessing through the input device 72. After the preprocessing, for example, the analysis execution processing unit 92 of the arithmetic device 64 executes an analysis execution process (S12) when receiving an analysis execution start signal instructing a start of the analysis execution process through the input device 72. After the analysis execution process, for example, the determination processing unit 94 of the arithmetic device 64 executes a determination process (S13) when receiving a determination start signal instructing a start of the determination process through the input device 72.

Figure 33:
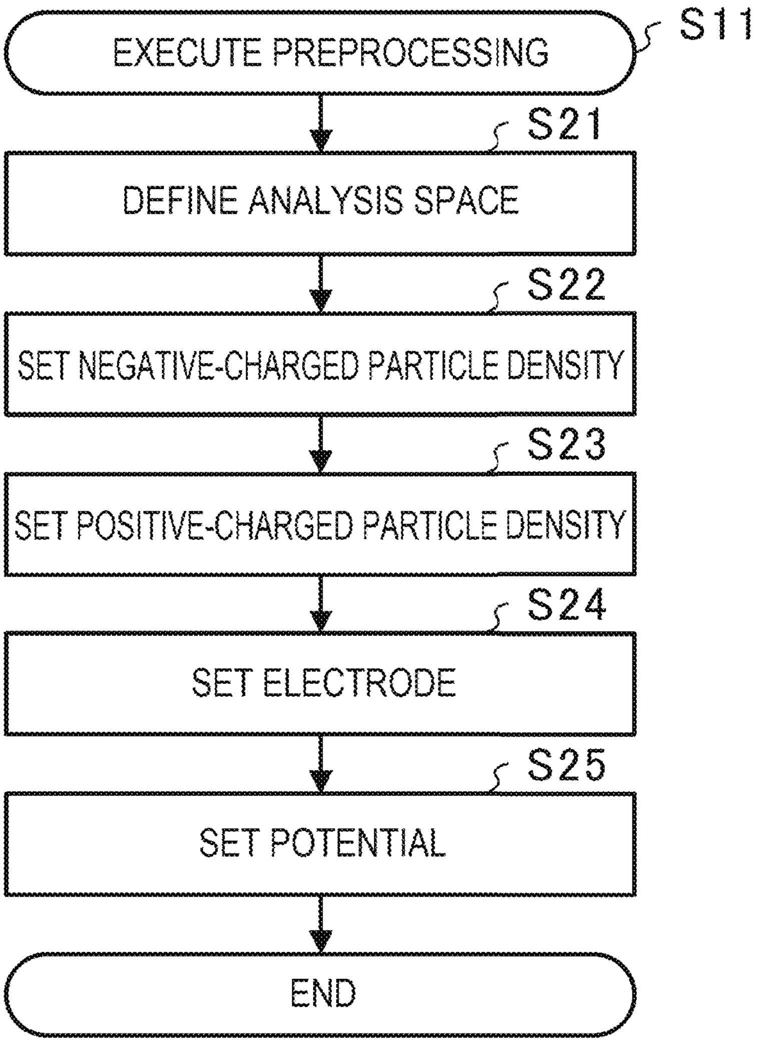
FIG. 33 is a flowchart illustrating a flow of preprocessing.

FIG. 33 is a flowchart illustrating a flow of the preprocessing (S11). When the preprocessing is started, the analysis preprocessing unit 90 first defines the analysis space 100 (S21). For example, the analysis preprocessing unit 90 sets a size of the analysis space 100, sets a size of the cell 102, and divides the analysis space 100 into a plurality of cells 102, thereby dividing the analysis space 100 into meshes. A user of the analysis device 50 may set the size of the analysis space 100, the size of the cell 102, and the like through the input device 72. Since it is assumed that the negative-charged particles n are advected between the cells 102, the size of the cell 102 may be set in consideration of the mobility of the negative-charged particles n.

Next, the analysis preprocessing unit 90 sets a negative-charged particle density in each cell 102 (S22), and sets a positive-charged particle density in each cell 102 (S23). For example, the analysis preprocessing unit 90 sets an initial value of zero for the negative-charged particle density and the initial value of zero for the positive-charged particle density.

Next, the analysis preprocessing unit 90 sets the first electrode 10 and the second electrode 12 in the analysis space 100 (S24). For example, the analysis preprocessing unit 90 sets a bar electrode as the first electrode 10 approximately at the center of the analysis space 100. The analysis preprocessing unit 90 sets a plate electrode as the second electrode 12 in the upper portion of the analysis space 100. The user may set a shape, a position, and a size of each of the first electrode 10 and the second electrode 12 through the input device 72.

After setting the electrodes, the analysis preprocessing unit 90 sets a first potential to the first electrode 10, sets a second potential to the second electrode 12 (S25), and completes the preprocessing. For example, in a case where the first electrode 10 is the negative electrode, a negative potential is set as the first potential, and in a case where the second electrode 12 is the positive electrode, a positive potential is set as the second potential. Polarities and values of the first potential and the second potential are set to polarities and values according to the purpose of analysis. The user may set the polarities and values of the first potential and the second potential through the input device 72.

In the preprocessing, the setting of the negative-charged particle density, the setting of the positive-charged particle density, and the setting of the electrodes are not limited to an exemplified order, and may be executed in any order. In addition, the setting of the potentials may be executed in any order after the setting of the electrodes is completed.

Figure 34:
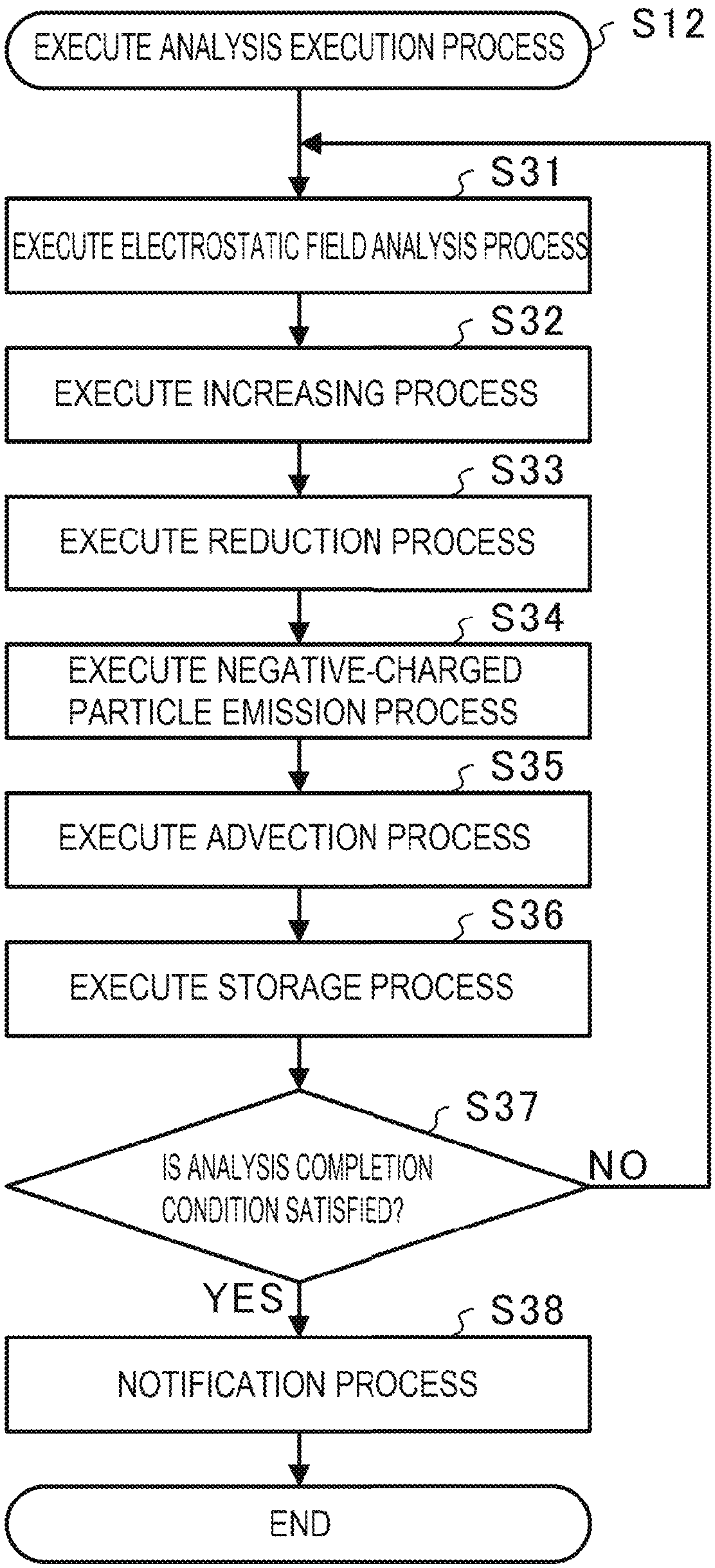
FIG. 34 is a flowchart illustrating a flow of an analysis execution process.

FIG. 34 is a flowchart illustrating a flow of the analysis execution process (S12). When the analysis execution process is started, the analysis execution processing unit 92 executes an electrostatic field analysis process (S31). The electrostatic field analysis process (S31) is a process of acquiring an electric field strength distribution in the analysis space 100 by deriving an electric field strength for each cell 102 of the analysis space 100 by the electrostatic field analysis.

In one example, the analysis execution processing unit 92 acquires the negative-charged particle density and the positive-charged particle density in the cell 102 at the present time in each cell 102. For example, in a first electrostatic field analysis process after the analysis execution process is started, an initial value of the negative-charged particle density and an initial value of the positive-charged particle density are acquired in each cell 102. The analysis execution processing unit 92 selects one cell 102 as a target and subtracts the positive-charged particle density from the negative-charged particle density in the cell 102 to derive a charge density in the cell 102.

The analysis execution processing unit 92 solves Poisson's equation illustrated in the following equation (1) using the derived charge density to derive a potential in the cell 102. In the equation (1), φ represents a potential, ρ represents a charge density, and ε represents a permittivity. As a method for solving the equation (1), various known analysis methods such as a finite element method can be used.

$$\nabla^2\phi + \frac{\rho}{\varepsilon} = 0 \tag{1}$$

The analysis execution processing unit 92 solves a relational expression between an electric field and a potential represented by the following equation (2) using the derived potential, and derives an electric field strength in the cell 102. In the equation (2), E represents an electric field, and φ represents a potential. As a method for solving the equation (2), various known analysis methods such as a finite element method can be used.

$$E = -\nabla\phi \tag{2}$$

The analysis execution processing unit 92 executes such derivation of the electric field strength for all the cells 102 in the analysis space 100. Accordingly, the electric field strength distribution at the present time in the analysis space 100 is obtained.

Next, the analysis execution processing unit 92 executes an increasing process (S32) of increasing the negative-charged particle density and the positive-charged particle density of the cell 102 satisfying a predetermined increase condition by a predetermined first coefficient in each cell 102 of the analysis space 100. The increase by the predetermined first coefficient means that the negative-charged particle density and the positive-charged particle density in the cell 102 at the present time are multiplied by a first coefficient having a value of 1 or more, so that the negative-charged particle density and the positive-charged particle density in the cell 102 are increased as compared to values before the multiplication by the first coefficient.

The predetermined increase condition is that the electric field strength in the cell 102 exceeds a predetermined first electric field threshold and the positive-charged particle density is equal to or less than a predetermined upper limit value. The first electric field threshold is set to, for example, a lower limit value of the electric field strength at which the neutral particles in the cell 102 are ionized. The upper limit value of the positive-charged particle density is set to, for example, any value to the extent that ions may actually present in the cell 102.

The predetermined first coefficient is set, for example, as a variable that increases in proportion to the electric field strength in the cell 102. The predetermined first coefficient may be set, for example, by combining a probability that the neutral particles are ionized based on the electric field strength in the cell 102, a probability that the neutral particles are ionized based on the collision of the moving negative-charged particles n, and a probability that the neutral particles are ionized based on the electromagnetic wave due to the recombination. That is, in the increasing process, it is simulated that the negative-charged particle density and the positive-charged particle density increase due to at least the ionization.

Next, the analysis execution processing unit 92 executes a reduction process (S33) of reducing the negative-charged particle density and the positive-charged particle density of each cell 102 in the analysis space 100 by a predetermined second coefficient. The reduction by the predetermined second coefficient means that the negative-charged particle density and the positive-charged particle density in the cell 102 at the present time are multiplied by a second coefficient having a value of less than 1, so that the negative-charged particle density and the positive-charged particle density in the cell 102 are reduced as compared to values before the multiplication by the second coefficient.

The predetermined second coefficient is set, for example, as a variable that is reduced in proportion to the electric field strength in the cell 102. The predetermined second coefficient is set based on, for example, a probability of recombination that actually occurs in the cell 102. That is, in the reduction process, it is simulated that the negative-charged particle density and the positive-charged particle density are reduced due to the recombination.

Next, the analysis execution processing unit 92 executes a negative-charged particle emission process (S34) simulating that the negative-charged particles n are emitted from the negative electrode.

The negative electrode corresponds to one electrode of the first electrode 10 and the second electrode 12 which has a lower set potential. In the negative-charged particle emission process, the analysis execution processing unit 92 acquires an electric field strength of a surface of the electrode corresponding to the negative electrode. In a case where the acquired electric field strength exceeds a predetermined second electric field threshold, the analysis execution processing unit 92 increases a negative-charged particle density of the cell 102 around the surface in the analysis space 100 by a predetermined third coefficient. The increase by the predetermined third coefficient means that the negative-charged particle density in the cell 102 at the present time is multiplied by a third coefficient having a value of 1 or more, so that the negative-charged particle density in the cell 102 is increased as compared to a value before the multiplication by the third coefficient. The second electric field threshold is set to, for example, a value at which electrons are actually emitted from the negative electrode.

The predetermined third coefficient is set, for example, as a variable that increases in proportion to the electric field strength in the cell 102. The predetermined third coefficient may be set as a variable that increases in proportion to a combination of the electric field strength in the cell 102 and the positive-charged particle density in the cell 102 of an emission destination. That is, in the negative-charged particle emission process, it is simulated that the negative-charged particle density is increased due to the emission of electrons from the negative electrode.

Next, the analysis execution processing unit 92 executes an advection process (S35) of simulating advection of the negative-charged particles n between the cells 102. In the advection process, the analysis execution processing unit 92 moves the negative-charged particles n of each cell 102 in the analysis space 100 based on the electric field strength distribution in the analysis space 100. For example, the analysis execution processing unit 92 compares the electric field strength in the cell 102 in which the negative-charged particles n to be moved are present with the electric field strength around the cell 102, and determines a movement direction of the negative-charged particles n to be moved from the cell 102, that is, the cell 102 of a movement destination of the negative-charged particles n. Then, the analysis execution processing unit 92 reduces the negative-charged particle density in the cell 102 of a movement source based on the number of negative-charged particles n flowing out, and increases the negative-charged particle density in the cell 102 of the movement destination based on the number of negative-charged particles n flowing in.

In one example, the analysis execution processing unit 92 solves a charge advection equation represented by the following equation (3). In the equation (3), ρ represents a charge density, μ represents mobility, and E represents an electric field. As a method for solving the equation (3), for example, various known analysis methods such as a constrained interpolation profile (CIP) method can be used.

$$\frac{d\rho}{dt} + \mu\nabla\cdot(E\rho) = 0 \tag{3}$$

In this manner, the negative-charged particle density of each cell 102 is updated in the advection process.

In the advection process, the analysis execution processing unit 92 derives an advection time during which the negative-charged particles n move by only one cell 102 in one advection process based on the mobility of the negative-charged particles n and the size of the cell 102. One process from the electrostatic field analysis process (S31) to the advection process (S35) simulates a phenomenon occurring within the advection time.

In the advection process, the analysis execution processing unit 92 may accumulate the advection time each time the advection process is executed, and derive time information indicating the elapsed time from an initial stage of analysis in the analysis space 100.

After the advection process, the analysis execution processing unit 92 executes a storage process (S36) of storing various kinds of information obtained in a series of processes from the electrostatic field analysis process to the advection process in the memory 82 or the storage device 62 in association with the time information in the analysis space. For example, in the storage process, a time in the analysis space when the electrostatic field analysis process is executed, and the negative-charged particle density and the positive-charged particle density in each cell 102 at that time are stored in association with each other.

Next, the analysis execution processing unit 92 determines whether an analysis completion condition is satisfied (S37). For example, regarding the analysis completion condition, the analysis execution processing unit 92 may determine that the analysis completion condition is satisfied in a case where a predetermined time has elapsed from the initial stage of the analysis in the analysis space. For example, the analysis execution processing unit 92 may count the number of times of repeated execution of the electrostatic field analysis process and determine that the analysis completion condition is satisfied in a case where the number of times of repeated execution reaches a predetermined number of times.

In a case where it is determined that the analysis completion condition is not satisfied (NO in S37), the analysis execution processing unit 92 returns to the electrostatic field analysis process (S31). Then, the analysis execution processing unit 92 repeatedly executes the electrostatic field analysis process (S31), the increasing process (S32), the reduction processing (S33), the negative-charged particle emission process (S34), and the advection process (S35) until the analysis completion condition is satisfied. The negative-charged particle density and the positive-charged particle density of each cell 102 are updated by the increasing process, the reduction process, the negative-charged particle emission process, and the advection process immediately before the repetition. Therefore, in the electrostatic field analysis process which is repeatedly executed again, an electric field strength distribution reflecting the negative-charged particle density and the positive-charged particle density updated immediately before the repetition is obtained.

In a case where it is determined that the analysis completion condition is satisfied (YES in S37), the analysis execution processing unit 92 executes a notification process (S38) of notifying an analysis result, and completes the analysis execution process. For example, the analysis execution processing unit 92 generates, based on the information stored in the storage process, an image indicating the distribution of the positive-charged particle density in the analysis space 100 by an amount of the image subjected to the electrostatic field analysis process. Then, the analysis execution processing unit 92 causes the display device 70 to display a video in which generated images are displayed in an order of passage of time. Accordingly, the user can easily grasp a temporal transition of the distribution of the positive-charged particle density in the analysis space 100.

In the above-mentioned example, the storage process is executed each time the electrostatic field analysis process is executed, and the notification process is executed based on the information stored by the storage process. However, the storage process may be omitted. In this case, the analysis execution processing unit 92 may generate an image indicating the distribution of the positive-charged particle density in the analysis space 100 each time the electrostatic field analysis process is executed, and may cause the display device 70 to display the image in real time.

Figure 35:
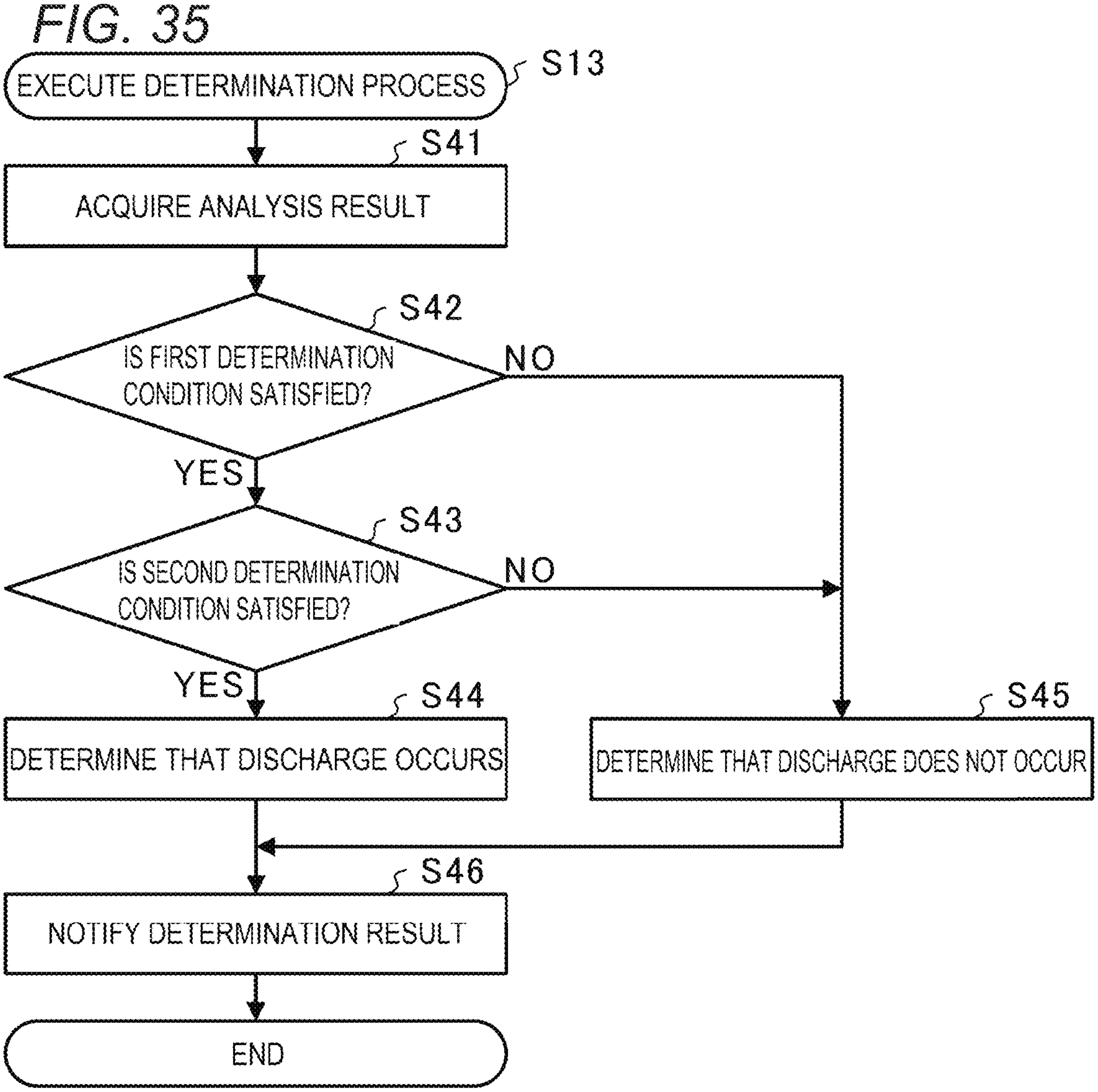
FIG. 35 is a flowchart illustrating a flow of a determination process.

FIG. 35 is a flowchart illustrating a flow of the determination process (S13). When the determination process is started, the determination processing unit 94 first acquires an analysis result by the analysis execution process (S41). For example, the determination processing unit 94 may read various kinds of information stored in the storage process (S36) from the memory 82 or the storage device 62.

Next, the determination processing unit 94 determines whether a predetermined first determination condition is satisfied (S42). The predetermined first determination condition is that a cell 102 in which the positive-charged particle density has changed to a predetermined first determination threshold or more is coupled from the first electrode 10 to the second electrode 12. The first determination threshold is set to, for example, a value such that the ionization region is considered to grow from the first electrode 10 toward the second electrode 12. That is, satisfying the first determination condition corresponds to the streamer 20 progressing from the first electrode 10 reaching the second electrode 12.

In a case where it is determined that the first determination condition is satisfied (YES in S42), the determination processing unit 94 determines whether a second determination condition is satisfied (S43). The second determination condition is that a cell 102 in which the positive-charged particle density has changed to a predetermined second determination threshold or more is generated in any analysis space 100. The predetermined second determination threshold is set to a value higher than the first determination threshold. The second determination threshold is set to, for example, a value capable of distinguishing whether the positive-charged particle density indicates the streamer 20 or the leader 22. That is, satisfying the second determination condition corresponds to the generation of the leader 22 in the analysis space 100.

Here, when the leader 22 is actually generated, it is estimated that it is difficult to prevent the occurrence of discharge thereafter. Therefore, in a case where it is determined that the second determination condition is satisfied (YES in S43) after it is determined that the first determination condition is satisfied, the determination processing unit 94 determines that discharge occurs (S44), and the process proceeds to a process of step S46.

In contrast, even when the streamer 20 progresses from the first electrode 10, it is estimated that discharge does not occur unless the streamer 20 reaches the second electrode 12. Therefore, in a case where it is determined that the first determination condition is not satisfied (NO in S42), the determination processing unit 94 determines that discharge does not occur (S45), and the process proceeds to the process of step S46.

In addition, even when the streamer 20 progressing from the first electrode 10 reaches the second electrode 12, it is estimated that discharge does not occur if no leader 22 is generated. Therefore, in a case where it is determined that the second determination condition is not satisfied (NO in S43) after it is determined that the first determination condition is satisfied, the determination processing unit 94 determines that discharge does not occur (S45), and the process proceeds to the process of step S46.

In step S46, the determination processing unit 94 notifies a determination result determined in step S44 or step S45 (S46), and completes the determination process. For example, the determination processing unit 94 causes the display device 70 to display the determination result.

As described above, in the analysis method of the present embodiment, the electrostatic field analysis process (S31), the increasing process (S32), the reduction process (S33), the negative-charged particle emission process (S34), and the advection process (S35) are repeatedly executed. In the electrostatic field analysis process, the electric field strength distribution in the analysis space 100 is acquired by deriving the electric field strength for each cell 102 of the analysis space 100 by the electrostatic field analysis. In the increasing process, in each cell 102 of the analysis space 100, the negative-charged particle density and the positive-charged particle density of the cell 102 satisfying a condition that the electric field strength exceeds the predetermined first electric field threshold and the positive-charged particle density is equal to or less than a predetermined upper limit value are increased by the predetermined first coefficient. In the reduction process, the negative-charged particle density and the positive-charged particle density of each cell 102 of the analysis space 100 are reduced by the predetermined second coefficient. In the negative-charged particle emission process, in a case where the electric field strength of a surface of one electrode of the first electrode 10 and the second electrode 12 which has a lower set potential exceeds the predetermined second electric field threshold, the negative-charged particle density of the cells 102 around the surface in the analysis space 100 is increased by the predetermined third coefficient. In the advection process, the negative-charged particles n of each cell 102 in the analysis space 100 are moved based on the electric field strength distribution in the analysis space 100, thereby updating the negative-charged particle density of each cell 102.

As described above, in the analysis method of the present embodiment, the negative-charged particle density and the positive-charged particle density of each cell in the analysis space are updated each time the electrostatic field analysis process is repeated. Therefore, in the analysis method of the present embodiment, the temporal transitions of the negative-charged particle density and the positive-charged particle density can be obtained. It is estimated that the temporal transitions of the negative-charged particle density and the positive-charged particle density simulate the occurrence process of discharge. Thus, according to the analysis method of the present embodiment, it is possible to analyze the discharge occurred in the space, and it is possible to enhance the understanding of the occurrence process of discharge.

For example, by using the analysis method of the present embodiment, it is possible to obtain temporal transitions of the negative-charged particle density and the positive-charged particle density when various parameters such as shapes and sizes of the first electrode and the second electrode, an inter-electrode distance of the first electrode and the second electrode, the first potential, and the second potential are changed. That is, when the analysis method of the present embodiment is used, for example, under which condition the leader change occurs to lead to the discharge can be examined in detail in a design of the electric device, and the design of the electric device that does not cause the discharge can be assisted.

In the analysis method of the present embodiment, when the first determination condition is satisfied and the second determination condition is satisfied after the first determination condition is satisfied, the determination process (S13) of determining that discharge occurs may be executed. Accordingly, in the analysis method of the present embodiment, it is possible to objectively determine whether the discharge occurs.

Although the embodiments of the present disclosure have been described above with reference to the accompanying drawings, it goes without saying that the present disclosure is not limited to the embodiments. It is apparent to those skilled in the art that various modifications and alterations can be conceived within the scope of the claims, and it is understood that the modifications and alterations naturally fall within the technical scope of the present disclosure.

According to the present disclosure, it is possible to analyze discharge occurred in a space.

What is claimed is:

1. An analysis method for analyzing discharge occurred in a space between a first electrode and a second electrode, the analysis method comprising:

dividing an analysis space in which an electrostatic field analysis is executed into cells;

setting, to the cells in the analysis space, a negative-charged particle density indicating how many negative-charged particles have a negative charge in one cell and a positive-charged particle density indicating how many positive-charged particles have a positive charge in one cell;

arranging the first electrode and the second electrode in the analysis space, setting a first potential to the first electrode, and setting a second potential to the second electrode;

executing an electrostatic field analysis process of deriving an electric field strength for each cell in the analysis space by an electrostatic field analysis to acquire an electric field strength distribution in the analysis space;

executing an increasing process of increasing, by a predetermined first coefficient, the negative-charged particle density and the positive-charged particle density of a cell that satisfies a condition that the electric field strength exceeds a predetermined first electric field threshold and the positive-charged particle density is equal to or less than a predetermined upper limit value among the cells in the analysis space;

executing a reduction process of reducing the negative-charged particle density and the positive-charged particle density of each of the cells in the analysis space by each predetermined second coefficient;

executing a negative-charged particle emission process of increasing, in a case where an electric field strength of a surface of one electrode of the first electrode and the second electrode which has a lower set potential exceeds a predetermined second electric field threshold, the negative-charged particle density of a cell around the surface in the analysis space by a predetermined third coefficient;

executing an advection process of updating the negative-charged particle density of each cell by moving the negative-charged particles of each cell in the analysis space based on the electric field strength distribution in the analysis space; and repeatedly executing the electrostatic field analysis process, the increasing process, the reduction process, the negative-charged particle emission process, and the advection process.

2. The analysis method according to claim 1, further comprising:

executing a determination process of determining that discharge occurs when a first determination condition is satisfied and a second determination condition is satisfied by repeatedly executing the electrostatic field analysis process, the increasing process, the reduction process, the negative-charged particle emission process, and the advection process, the first determination condition being that a cell in which the positive-charged particle density changes to a predetermined first determination threshold or more is coupled from the first electrode to the second electrode, and the second determination condition being that a cell in which the positive-charged particle density changes to a predetermined second determination threshold, which is higher than the first determination threshold or more, is generated in the analysis space after the first determination condition.

* * * * *